United States Patent [19]

Fairhead et al.

[11] 4,283,484

[45] Aug. 11, 1981

[54] METHOD OF MAKING RELIEF PRINTING PLATES WITH CONCAVE PRINTING AREAS

[75] Inventors: Michael J. B. Fairhead; Nicholas R. Jung, both of London, England

[73] Assignee: Letraset USA, Inc., Paramus, N.J.

[21] Appl. No.: 4,618

[22] Filed: Jan. 19, 1979

Related U.S. Application Data

[62] Division of Ser. No. 875,554, Feb. 6, 1978, abandoned.

[30] Foreign Application Priority Data

Feb. 7, 1977 [GB] United Kingdom ................ 4911/77

[51] Int. Cl.³ .............................................. G03C 5/00
[52] U.S. Cl. ................................... 430/306; 430/300; 430/307
[58] Field of Search ....................... 430/300, 306, 307

[56] References Cited

U.S. PATENT DOCUMENTS

| 2,177,195 | 10/1939 | Wilkinson | 430/307 |
| 3,658,532 | 4/1972 | Gilligan | 430/307 |
| 4,012,257 | 3/1977 | Gerns | 430/307 |

FOREIGN PATENT DOCUMENTS 737099  9/1932  France ................................... 101/368

*Primary Examiner*—Jack P. Brammer
*Attorney, Agent, or Firm*—Darby & Darby

[57] ABSTRACT

Relief printing plates are described in which the raised printing areas are concave or dished. This gives, on printing, a more even ink distribution over the image area. Photographic methods for producing such plates are described.

7 Claims, No Drawings

METHOD OF MAKING RELIEF PRINTING PLATES WITH CONCAVE PRINTING AREAS

This is a division of copending application Ser. No. 875,554, filed Feb. 6, 1978 abandoned.

This invention relates to relief printing plates.

In various printing methods, relief printing plates are used. The desired printed image is defined by a plurality of areas raised relative to a surrounding level. Ink is applied to the surface of the raised areas and thereafter transferred from them on to the desired receptor, e.g. a sheet of paper or plastics film, by bringing the receptor into contact with the printing plate. In order to secure adequate transfer of printing ink to the surface to be printed it is necessary to bring the printing plate and sheet together under a certain pressure but this pressure tends to squeeze the ink lying on the raised areas to the edges of those raised areas. There is accordingly a tendency for the individual parts of the printed image each to be composed of an outer portion of high optical density corresponding to relatively high ink deposition, an annular region inwardly of that border of relatively low optical density and corresponding to the geometrical outline of the raised area on the printing plate and a central area of optical density intermediate that of the annular region and the dense border region. In some applications, particularly where high printing definition is not required and where even the annular region is relatively dense, this uneven ink distribution is of no consequence. However, in many high quality printing applications, particularly the printing of texture patterns e.g. for cartographic and other uses, this unevenness is highly disadvantageous, especially when the printed image is to be used as a master for the product e.g. of a planographic printing plate.

According to the present invention there is provided a relief printing plate having a plurality of raised printing areas adapted to receive a film of ink, the upper surface of each area consisting of a relatively higher peripheral region and a relatively lower central region.

When using a printing plate constructed in this way, when the plate is inked up, the printing ink layer on each raised area is thicker in the middle and relatively thin on the edges. When the printing plate is used, the printed image is of substantially constant optical density over its entire area, provided that the contact printing pressure is appropriately chosen, but that pressure can be chosen in a range sufficiently high to give good print quality.

While it is possible by using sophisticated masking and etching techniques in a multistage process to produce relief plates according to the invention made of metal, the invention is of particular value when used to make printing plates by photopolymerisation, in particular because printing plates according to the invention may be made in one set of processing steps by using appropriate masking techniques.

In the manufacture of a conventional relief printing plate using photopolymerisable material, the relief image is built up by contact exposing a layer of photopolymerisable material on a suitable base through a negative of the desired image. Where the light passes through the negative, polymerisation takes place in the photopolymerisable layer and renders those parts of the layer relatively insoluble. Development to dissolve away unexposed portions of the layer thereafter leaves a relief printing plate which can then be put to use.

In order to manufacture a printing plate according to the invention by photopolymerisation methods it is only necessary to reduce the amount of light falling in the centres of the transparent areas of the negative. This is easiest achieved by placing over the negative through which the photopolymerisable material is exposed a positive which corresponds to the desired printed image but in which each individual portion although correctly situated relative to the other portions of the image is either reduce in size, or is spaced from the negative image sufficiently to allow light to diffuse through the light-transmitting areas of the negative image.

It is desirable to register the positive with the underlying negative, but even if registration is not exact, so long as the areas on the positive fall within the areas on the negative, the desired plate is produced after development, i.e. a plate having raised areas each including a depressed portion.

Registration of a positive and negative may be achieved by a number of methods. For some applications, it is possible to secure satisfactory results using mechanical pin registration techniques. For example, a photographic positive and a photographic negative may each be made on a stable film base punched with register apertures which are set on precisely machined steel pins. This method of registration, however, can prove unsatisfactory if the images are very finely detailed. In such cases, it is preferred to form a composite image material including two layers, one of which comprises a positive image and the other of which comprises a negative image. Such materials are conveniently produced by taking a conventionally produced positive or negative, laminating a negative working photosensitive material thereto, exposing the laminated assembly to expose the negative working sensitised material imagewise, and developing the so exposed material to produce an image. The two images are accordingly produced in exact register over the whole of the image carrier which register is automatically maintained since the whole assembly is laminated together.

On contact exposure of a photopolymerisable printing plate base material with the negative image in contact with the photopolymerisable layer, the desired effect is obtained provided that the layer of film base present between the two image layers is of appropriate thickness relative to the lateral size of the image areas. If the thickness of film base between the two image bearing layers is insufficient, then the diffusing effect within the layer will not be sufficient to enable light from the diffuse exposure source to cover the whole of the area underneath the positive non-light transmitting areas and the areas of photopolymerised material on the relief printing plate produced will have totally hollow insides, e.g. instead of a dot of generally frustoconical shape with a dished upper surface, a circular ridge will be produced. If on the other hand the thickness of the film base between the positive and negative image layers is too great, too much light will diffuse behind the positive image areas and the desired depressed area will not be formed but instead, in the case of a dot, the relief printing plate will have a flat topped frustocone rather than a dished or concave topped frustocone as desired.

Generally speaking, it is found that satisfactory results are obtained where the size of the image areas in the positive layer is from 3 to 6 times the thickness of the film base separating the positive and negative images in the composite material. The degree of dishing or concavity achieved on the relief printing plate will depend not only on the characteristics of the image material but on the exposure time. A test strip can easily be made to determine the optimum exposure time for any particular type of image, sections of the strip being exposed for progressively longer times and the resulting test strip being inspected visually to select the optimum exposure time.

It will be appreciated that the negative image containing layer of the composite material must be in contact with the photopolymerisable material from which the relief printing plate is manufactured during exposure and accordingly that the positive image layer must either be sandwiched between two layers of film base or alternatively separated from the negative working layer by two layers of film base if preformed photographically sensitised material consisting of film base and an emulsion layer is used. If desired, though it may be inconvenient to do so, a photographically sensitised emulsion may be produced on a film base on the side of the film base opposite to a negative image developed emulsion layer. The positive image generated by imagewise exposure and developing can then be satisfactorily formed though the resulting material may be somewhat delicate to handle having an exposed emulsion surface on either side. Special measures may need to be taken if the positive images formed by exposure and development of the negative working emulsion from which the positive image is formed is sandwiched between two layers of film base since in such cases it is difficult to develop the exposed layer.

It is found generally preferably, in order to work with adequate definition, to produce the negative image in standard fashion and form the positive therefrom. However because of the difficulties of developing a positive image in an imagewise exposed layer between two layers of film base, it is more convenient, when the result is acceptable, to form a positive image by standard means, laminate the developed positive image to a layer of sensitised material with a negative working emulsion and then form the negative image by exposure through the positive image and development.

The following examples will serve to illustrate the invention.

EXAMPLE 1

A Nyloprint sensitised plate (ex B.A.S.F.) was taken and covered with a photographic negative of a texture pattern. The pattern was a regular array of circular dots on a square grid. Dot diameter was 0.66 mm and dot spacing 0.92 mm. A photographic positive with a dot image of identical array and spacing but with dots of size only 0.47 mm was then aligned over the negative, and the sandwich so formed contact exposed to diffuse light for 5.5 mins in a vacuum exposure frame.

The plate was then washed in solvent for 10 mins to leave a relief printing plate in which each raised area was a circular area of upper edge diameter 0.66 mm with a depression in its upper face. This was used in a proofing press to print a dot pattern on to glossy stabilised cellulose diacetate film. The printed dots had a smooth density profile rising sharply at the edges of the image to a central gently arched curve.

EXAMPLE 2

A lith film ("DuPont COD 7") negative of a 40%, 10.75 lines/inch dot pattern was punched, utilising a "Protocol" register punch in register with a Lith film (DuPont COD 7) positive of the same pattern, emulsion side down.

Using "Protocol" register pins placed in the punched holes to retain registration, the films were placed onto a piece of S94 Nyloprint photopolymer plate material (after removal of the protective material from the plate), negative film emulsion in contact with the Nyloprint photopolymer material. The sandwich was then exposed in a Nyloprint flat exposure unit in the recommended fashion using the vacuum contact system that is part of the machine to facilitate adequate contact.

The exposure time was twelve (12) minutes.

After exposure, the plate was developed by means of a Nyloprint flat spray washout unit using standard washout solution for a period of ten minutes at a solvent temperature of 30° C. ±5° C.

The developed plate was then rinsed with uncontaminated washout solution, partially dried with a chamois leather and allowed to dry in a BASF drying cabinet at a temperature of 30°±10° C. for a period of one hour.

EXAMPLE 3

The emulsion side of a Lith film positive (Agfa Gevaert 081 PTM) of a 40% 11.75 lines/cm dot pattern was laminated in safelight conditions using a low tack water-based acrylic adhesive to the non-emulsion side of a piece of unexposed film of the same material.

The laminate was then positioned, positive uppermost, in a vacuum contact frame placed upon the copyboard of a DeVere 54 Varicon enlarger equipped with a Rodenstock Rodagen 50 mm lens, at f5.6 and upper and lower condensers of 120 mm and 100 mm respectively.

The light source was tungsten and was positioned one meter from the copyboard; the enlarger was focussed to produce a sharp image of the empty film carrier.

The unexposed film material was exposed for 15 seconds through the positive and the laminate then processed normally to form a negative with a corresponding positive in register.

To produce a printing plate from the laminate, a piece of S94 Nyloprint photopolymer plate material was exposed and processed in the normal fashion but using the negative/positive sandwich instead of the usual negative. The exposure time was eighteen minutes and the development time, in a Nyloprint flat spray wash-out unit, was ten minutes at a temperature of 30° C. ±8° C.

After development, the plate was rinsed with uncontaminated wash-out solution, partially dried with a chamois leather and finally allowed to dry in a BASF drying cabinet at a temperature of 30° C. ±10° C. for a period of one hour.

The words Nyloprint, Protocol, Varicon and Rodagen used herein are Registered Trade Marks.

We claim:

1. A method of manufacturing a printing plate which comprises the steps of
   imagewise exposing a photopolymerisable material layer formed on a layer of base material through a negative of the desired image in which the light transmitting areas are partly covered by a corresponding positive image,
   developing the exposed layer to leave a plurality of raised printing areas adapted to receive a film of ink,
   the time and intensity of exposure being such that the upper surface of each area consists of a relatively higher peripheral region and a relatively lower central region.

2. The method of claim 1 wherein the non-light transmitting areas of the positive image are reduced in size relative to the light transmitting areas of the negative image.

3. The method of claim 1 wherein the positive and negative images are otherwise identical and spaced from one another during exposure of the photopolymerisable material from a diffuse light source.

4. The method of claim 1 wherein the photopolymerisable material is contact exposed to light from a diffuse light source wherein the image material consists of a negative image layer, supporting film base layer and a positive image layer which has been generated by imagewise exposure from the negative image layer and subsequent development.

5. The method of claim 1 wherein the photopolymerisable material is contact exposed to light from a diffuse light source wherein the image material consists of a positive image layer, supporting film base layer and a negative image layer which has been generated by imagewise exposure from the positive image layer and subsequent development.

6. A method of producing a relief printing plate comprising the steps of:
  (a) providing a photographic negative of the desired image;
  (b) generating from the photographic negative a photographic position of the desired image;
  (c) assembling the photographic negative and positive in register with one another;
  (d) contact exposing a photopolymerisable printing plate layer imagewise from a diffuse light source with the negative image in contact with the photopolymerisable layer, and
  (e) developing the photopolymerisable layer.

7. A method according to claim 6 wherein registration of positive and negative images is achieved by laminating a photographically sensitised negative-working image layer to the photographic negative.

* * * * *